United States Patent [19]

Baldwin et al.

[11] Patent Number: 5,051,791

[45] Date of Patent: Sep. 24, 1991

[54] APPARATUS COMPRISING REFRACTIVE MEANS FOR ELECTIONS

[75] Inventors: Kirk W. Baldwin, Springfield; Loren N. Pfeiffer, Morristown; Joseph Spector, High Bridge; Horst L. Stormer, Summit; Kenneth W. West, Mendham, all of N.J.

[73] Assignee: AT&T Bell Laboratories, Murray Hill, N.J.

[21] Appl. No.: 492,525

[22] Filed: Mar. 12, 1990

[51] Int. Cl.$^5$ .............................................. H01L 29/50
[52] U.S. Cl. .......................................... 357/22; 357/4; 357/16
[58] Field of Search ............. 357/22 A, 22 MD, 22 S, 357/15, 16, 22 I, 4

[56] References Cited

U.S. PATENT DOCUMENTS 4,962,410 10/1990 Kriman et al. ....................... 357/15

OTHER PUBLICATIONS

Sivan, U. et al., "Hot Electron Transport in Two Dimensional Electron Gas" Solid State Electronics, vol. 33, No. 7, pp. 979–986, 1990, published in Solid State Electronics, vol. 32, No. 12, 1989.
"Electron Mobilities in Modulation-Doped GaAs—(AlGa) as heterostructures", H. L. Stormer, Surface Science, vol. 132, No. 1-3, pp. 519–526 (1983).
"Quantized Conductance of Point Contacts in a Two-Dimensional Electron Gas", B. J. van Wees, H. van Houten, C. W. J. Beenakker, J. G. Williamson, L. P. Kouwenhoven, D. van der Marel, C. T. Foxon, Phys. Rev. Lett., vol. 60, No. 9, pp. 848–850 (1988).
"Coherent Electron Focussing in a Two-Dimensional Electron Gas", H. van Houten, J. E. Mooij, C. W. J. Beenakker, J. G. Williamson, C. T. Foxon, Europhysics Lett. 5(8), pp. 721–725 (1988).
"Annual Report", College of Eng. and Appl. Sciences, Arizona State Univ., G. H. Bernstein, A. M. Kriman, B. S. Haukness, D. K. Ferry, pp. 24–25 (1988).
"Control of Ballistic Electrons in Macroscopic Two-Dimensional Electron Systems", J. Spector, H. L. Stormer, K. W. Baldwin, L. N. Pfeiffer, K. W. West, Appl. Phys. Lett. 56(10), pp. 967–969 (1990).
"Two-Dimensional Electron Optics", J. S. Spector, Bulletin of the American Physical Society, vol. 35(3), Mar. 1990, p. 613.
"Ballistic Transport in 2DEG", M. Heiblum, Bulletin of the American Physical Society, vol. 35(3), Mar. 1990, p. 612.

Primary Examiner—Andrew J. James
Assistant Examiner—Sara W. Crane
Attorney, Agent, or Firm—E. E. Pacher

[57] ABSTRACT

The disclosed novel solid state electronic devices comprise a two-dimensional electron gas (2DEG), emission means of ballistic 2DEG electrons, collection means of 2DEG electrons, and control means disposed between the emissions means and the collection means such that ballistic 2DEG electrons that travel from the emission means to the collections means pass through a portion of the device that underlies the control means. By means of the control means the electron density in the portion of the device can be changed, whereby the path of ballistic 2DEG electrons can be affected, in a manner analogous to refraction in optics. This "electron refraction" makes possible a variety of devices, e.g., switches and logic elements.

8 Claims, 4 Drawing Sheets

APPARATUS COMPRISING REFRACTIVE MEANS FOR ELECTIONS

TECHNICAL FIELD

This invention pertains to the field of solid state electronic devices.

BACKGROUND OF THE INVENTION

In recent years it has become possible to manufacture semiconductor structures in which the mobile charge carriers (typically electrons) are confined to a region whose extent in one dimension is so limited that the mobile charge carriers can be considered a 2-dimensional electron gas (2 DEG). For a discussion of 2 DEG see, for instance, H. L. Stormer, *Surface Science*, Vol. 132(1–3) pp. 519-526.

B. J. van Wees, et al., *Physical Review Letters*, Vol. 60(9), pp. 848-850 (1988), have studied ballistic point contacts, defined in the 2 DEG of a GaAsAlGaAs heterostructure. The point contact is defined by electrostatic depletion of the 2 DEG underneath a gate formed by means of an appropriately patterned metallization layer on the semiconductor heterostructure. By varying the voltage applied to the gate the effective width of the point contact could be varied. H. van Houten, et al., *Europhysics Letters*, Vol. 5(8), pp. 721-725 (1988) reported electron focusing in a 2 DEG by means of a magnetic field. And G. H. Bernstein, et al., *Annual Report, College of Engineering and Applied Sciences, Arizona State University*, pp. 24-25, Jul. 1, 1988, have proposed an "electron diffraction transistor" which comprises a split gate and a multiplicity of angularly spaced drain "fingers". Simulation is reported to show that such a device can exhibit finger-to-finger variations in current that oscillate with angle, and corresponding fixed angle currents that oscillate with gate voltage.

SUMMARY OF THE INVENTION

In a broad aspect the invention is apparatus that comprises a novel 2 DEG device, namely, a device wherein electrons are caused to pass through a region wherein the electrostatic potential can be varied by means of voltage applied to control means that overlie the region. Such a novel device can serve in a variety of applications, e.g., as a switch or as a logic device.

More particularly, the device comprises electron emission means, electron collection means that are spaced apart from the emission means, with the control means disposed between the emission means and the collection means. The device further comprises means for making electrical contact to the emission means, the control means, and the collection means. Typically, a signal source is connected to the control means, and some appropriate utilization means is connected to the collection means. As indicated above, in devices according to the invention the control means are adapted for changing the electrostatic potential in the portion of the device that underlies the control means. Significantly, the control means are situated such that electrons that travel from the emission means to the collection means pass through the portion that underlies the control means. The control means generally comprise electrode means such as an appropriately shaped metal layer. Exemplarily, the device comprises a semiconductor heterostructure (e.g., a GaAs/AlGaAs structure), with the mobile electrons of the 2 DEG confined to the region at, and/or close to, the heterostructure interface.

In many cases, the critical dimensions of the inventive device, e.g., the distance between the emission means and the collection means, are chosen to be less than the elastic mean free path of the electrons in the 2 DEG. However, this is not a necessary condition, and the critical dimension could be larger than, even 2-3 times larger than, the elastic mean free path, even though this will typically result in lower signal amplitude. It will be understood that the relevant mean free path is the elastic mean free path of the electrons at the operating temperature of the device, exemplarily 4.2K. The "elastic mean free path" herein is that path length at which a fraction 1/e of a beam of ballistic electrons in a 2 DEG has lost its forward momentum due to elastic scattering.

Those skilled in the art will appreciate that application of a voltage to the control means can change the density of mobile electrons in the portion of the 2 DEG that underlies the control means. Furthermore, they will appreciate that such a change in electron density is analogous to a change in the "refractive index" of the portion, as it pertains to the motion of electrons that traverse the portion. By keeping in mind the analogy between electron density in devices according to the invention and refractive index in conventional optics, the principles of operation of devices according to the invention will be readily comprehensible to those skilled in the art. In some embodiments of the invention the control means are adapted for changing the angle of divergence of the beam of ballistic 2 DEG electrons emitted by the emission means. Such control means can, for instance, act as beam collimators.

There is one very significant difference between refractive index as it applies to optical devices and the "refractive index" associated with the electron density in devices according to the invention. The former in general is a fixed parameter whereas the latter can be readily varied. This makes possible novel devices that do not have optical analogs. Among these are "lenses" of variable focal length, "prisms" of variable refractive strength, and cavities of fixed geometrical length but variable "optical" length.

DETAILED DESCRIPTION OF SOME EXEMPLARY EMBODIMENTS

Before describing some currently preferred embodiments we will derive expressions describing the effect of a potential step on the propagation of a ballistic electron in a 2 DEG.

An electron of wave vector $\vec{k}$ and kinetic energy $$E = \frac{\hbar^2 k^2}{2m^*}$$

traversing an extended potential $\Delta V$ changes its kinetic energy to $$E' = E + e\Delta V = \frac{\hbar^2 k'^2}{2m^*}.$$

Figure 1:
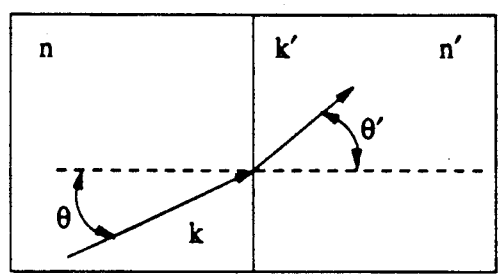
FIG. 1 schematically illustrates the refraction of ballistic electrons at a potential step.

In these expressions h is Planck's constant divided by $2\pi$, and m* is the effective electron mass in the material. Translational invariance along the step preserves the parallel component of electron momentum and thus k sin $\theta$ = k' sin $\theta'$, with the angles $\theta$ and $\theta'$ defined in FIG. 1. This equation can be expressed as $$\frac{\sin\theta}{\sin\theta'} = \frac{|k'|}{|k|} = \sqrt{E'/E},$$

which resembles Snell's law in optics. The reflection coefficient $$R = \left(\frac{S-1}{S+2}\right)^2$$

and transmission coefficient $$T = 1 - R = \frac{4S}{(S+1)^2}, \text{ where } S = \sqrt{E'/E} \frac{\cos\theta'}{\cos\theta},$$

can be similarly derived by calculating the probability current for the different components and requiring continuity of the wave function and its derivative at the interface. All these equations are analogous to the optical case if one defines the square root of the electron kinetic energy as being proportional to an effective index of refraction. In a degenerate system such a definition becomes quite meaningful since all relevant electrons have the same kinetic energy $E_f = h^2 k_f^2 / 2 m^*$, the Fermi energy. At an abrupt interface separating regions of different electron density, the relevant kinetic energy changes from $E_f$ to $E'_f$. The refracting power of such an abrupt density step is determined simply by the ratio of the adjacent Fermi energies, $E_f$ to $E'_f$. In 2 D electron systems abrupt steps in density can be readily created via electrostatic gates in close proximity to the 2 D channel. The edge of such a gate acts as the refractive perimeter whose refracting power is controllable by the gate voltage. Furthermore, since in 2 D the carrier density n and $E_f$ are related by the equation $$E_f = \frac{2\pi h}{m^*} n,$$

Snell's law translates into $$\frac{\sin\theta}{\sin\theta'} = \sqrt{n'/n}$$

with n and n' denoting the density surrounding the gate and beneath the gate, respectively.

Figure 2:
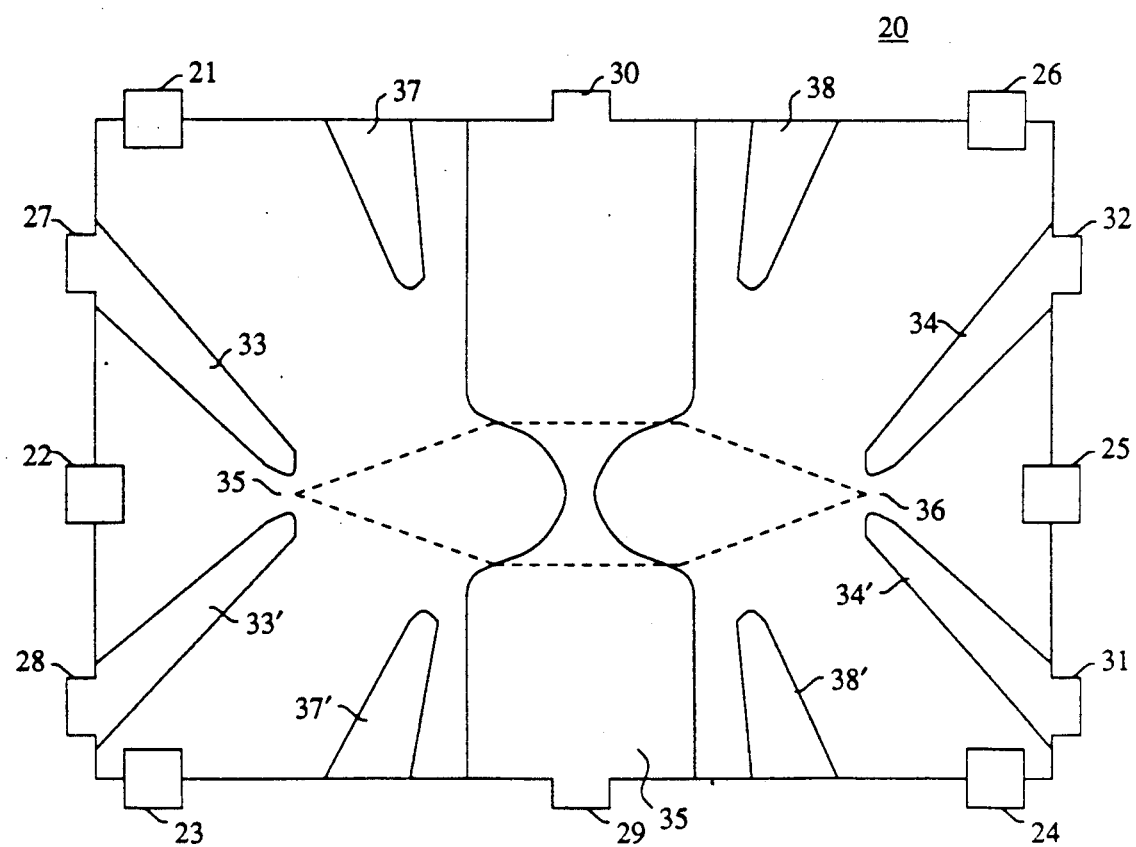
FIGS. 2, 4 and 6 schematically depict, in top view, exemplary devices according to the invention.

FIG. 2 shows in top view relevant features of a particular embodiment of the invention. Semiconductor body 20 comprises a modulation-doped heterojunction, e.g., a GaAs/AlGaAs heterojunction, with Si $\delta$-doping about 70 nm removed from the interface. The distance between the 2 DEG and the top surface of the body 20 was about 615 nm. The carrier density in the dark was $n_d = 1.4 \times 10^{11}$ cm$^{-2}$ at a mobility of $\mu_d = 5.4 \times 10^6$ cm$^2$/Vsec. After standard illumination with visible light these parameters were increased to $n_l = 2.06 \times 10^{11}$ cm$^{-2}$ and $\mu_l = 8.5 \times 10^6$ cm$^2$/Vsec, equivalent to an elastic mean free path of 64 $\mu$m.

In FIG. 2, numerals 21-26 refer to ohmic contacts to the semiconductor body, and numerals 27-32 to contact points to patterned metal regions on the surface of the body. Even though the embodiment of FIG. 2 not only is essentially symmetrical about an axis from 22-25 but also about an axis from 29-30, for purposes of exposition, metallized regions 33 and 33' are considered to be part of the emission means, and regions 34 and 34' are considered part of the collection means. Metallized region 35 is part of the control means. The above referred-to metallized regions, frequently referred to as "gates", are formed in a known way by photolithographically patterning a Ti/Au layer. Diffused Au/Ge/Ni regions serve as ohmic contacts 21-26.

Gates 33, 33' and 34, 34' define planar orifices 35 and 36, respectively. The gates are biased to deplete the electron gas underneath. Electrons flowing from ohmic contact 22 to contact 25 have to pass through these orifices. Those not scattered between orifice 35 and the control element also pass beneath the control element, whose central portion has bi-concave shape for efficient electron focusing between orifices 35 and 36. The concave shape is necessary for a converging "lens" since, contrary to the usual situation in optics, the "refractive index" (n') of the lens is less than that of the surrounding space. The lens shape was determined numerically by a known ray tracing procedure, and is not necessarily accurately rendered in FIG. 2.

Optional diffused Au/Ge/Ni regions 37, 37', 38 and 38' function as electron absorbers, similar to irises in the optical case. Their functioning has been described in J. Spector, et al., *Applied Physics Letters*, Vol. 56(10), pp. 967-969 (1990).

By means of a known technique we determined the dependence of n'($V_c$), the electron density beneath the control element, on $V_c$, the voltage applied to the control element, and found that $n'(V_c) = 1.10 \times 10^{11}(V_c + 1.40)$cm$^{-2}$, where $V_c$ is in volt. Thus, given the outside carrier density n, $V_c$ uniquely determines the refracting power of the perimeter of region 35 and, therefore, the "focal length" of the lens. Varying $V_c$ thus is equivalent to varying the refractive index.

Figure 3:
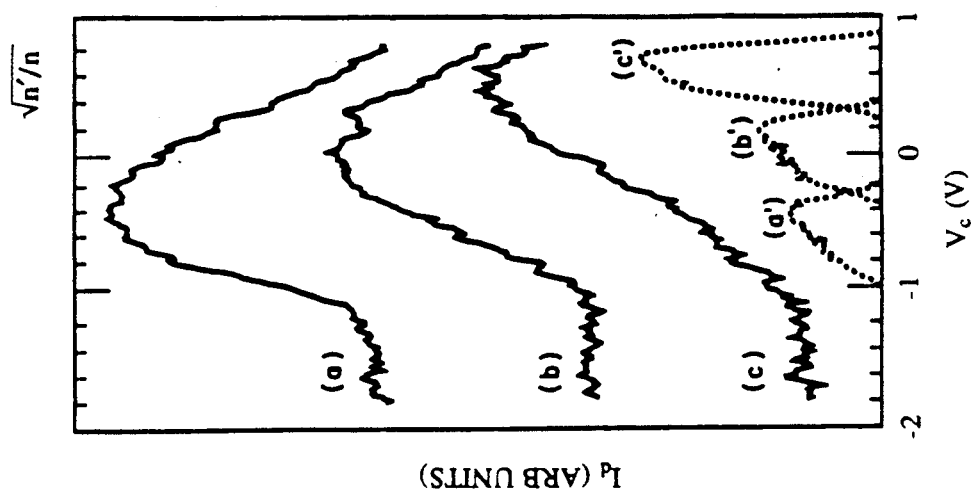
FIGS. 3 and 5 show exemplary results pertaining to the embodiments of FIGS. 2 and 4, respectively.

FIG. 3 shows exemplary data on the current injected at contact 22 that is collected at contact 25, as a function of the lens bias voltage $V_c$. Exemplarily, a current of 100 nA, designated $I_e$, is passed between contacts 22 and 23. The associated voltage drop of 50 $\mu$V occurs almost exclusively over constriction 35 being set by the depletion of gates 33 and 33' to create an orifice of 0.7 $\mu$m width, equivalent to 500$\Omega$ resistance. Ballistic carriers from 35 either hit or miss the detector orifice 36, which exemplarily was also set to 500$\Omega$. Contact 25 is connected to a voltage measuring device, thus no net current flows through contact 25. The current $I_d$ which ballistically flows into detector orifice 36, must be compensated by an equal current flowing out. This causes a voltage to be built up that is equal to $I_d \times 500\Omega$. Measurement of this voltage thus permits determination of $I_d$. As FIG. 3 clearly shows, $I_d$ strongly depends on $V_c$. The exemplary embodiment thus can serve, for instance, as a switch or logic element.

For n'→0 the electron path between 35 and 36 is totally disrupted. As n' increases most electrons are totally reflected due to the high reflectivity of the lens' perimeter. The fraction of ballistic electrons traversing the lens increases rapidly as n' rises but most carriers continue to miss constriction 36 since the focal point lies between the lens and 36. The number of electrons hitting the orifice increases and reaches a maximum at $\sqrt{n'/n}$ approximately equal to 0.87. For larger values of n' the focal point moves behind 36 leading to a renewed drop in the collected current $I_d$. At n'=n all electrons pass the lens without refraction.

Figure 4:
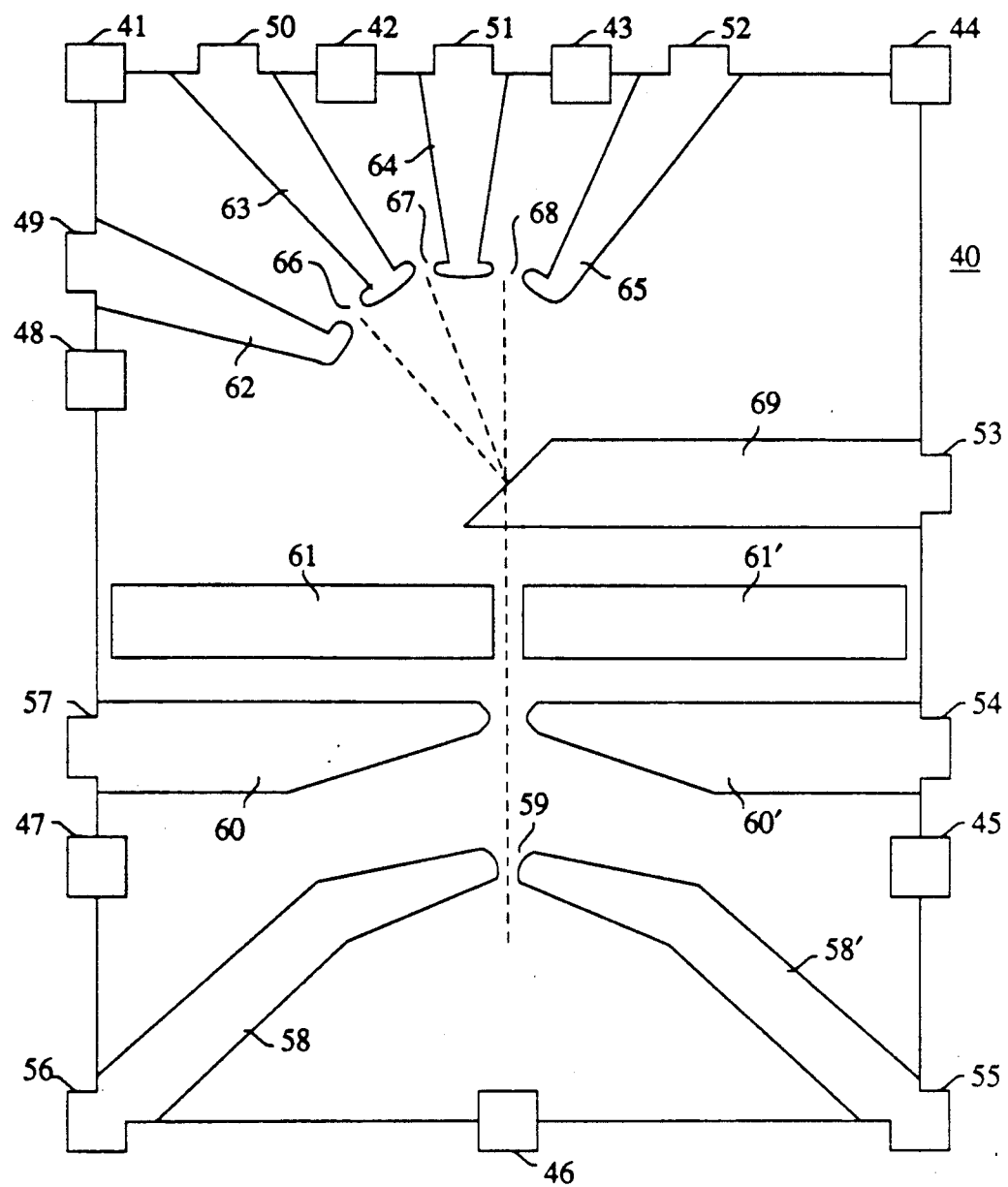

A further exemplary embodiment of the invention is depicted in FIG. 4. The semiconductor body 40 comprises a 2 DEG with properties similar to those of the previously described embodiment. Numerals 41–48 refer to ohmic contacts (diffused Au/Ge/Ni) to the semiconductor body, and numerals 49–57 to contacts to appropriately shaped metallized (Ti/Au) regions. Regions 58 and 58' define orifice 59 and are part of the emission means. Optional regions 60 and 60' define a further orifice and serve as electron collimator, together with the optional absorber formed by (diffused Au/Ge/Ni) regions 61 and 61'. Regions 62–65 define orifices 66–68 and are part of the collection means. Region 69 is part of the control means, serving to refract ballistic electrons that are injected through orifice 59, have passed through the collimator and have passed beneath the control means. The control means are analogous to a prism. The angle of refraction upon exiting the region beneath 69 is controlled by the bias voltage $V_c$ applied to 53.

The emitter orifice 59 is created by biasing gate pair 58, 58' to deplete the electron gas underneath. Current flowing from ohmic contact 46 must therefore flow through orifice 59. Similarly, the three collector orifices 66, 67 and 68, associated with ohmic contacts 41, 42 and 43, are formed by metal regions 62–65, respectively. By adjusting the gate biases, the emitter orifice width exemplarily was set to 1.5 μm and the three collector orifices were each set to 0.8 μm, as determined from the electrical resistance through the orifices. Gate pair 60, 60' was biased similarly to form the collimator. The carriers injected at 59 which do not propagate in the direction of the collimator orifice were blocked from reaching the collector region. The absorbers 61, 61' act as an additional collimator and also eliminate stray reflections from the edges of the first collimator orifice.

Figure 5:
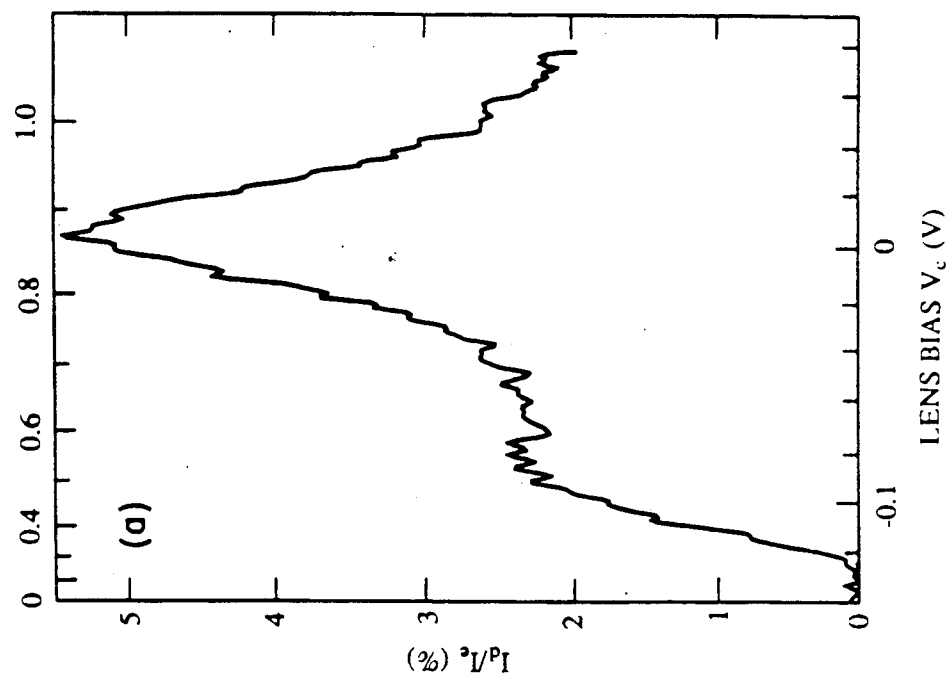

The ballistic carriers were injected at emitter orifice 59 by the application of a constant amplitude 1 μA current from 46 to 45. The current arriving at each of the collector orifices was monitored by measuring the induced voltage in each of the three contacts 41, 42, and 43 with respect to contacts 48 and 44, which were externally connected. The three collected currents, measured as described above, are shown in FIG. 5 as functions of $V_c$. Traces (a), (b), and (c) are the collected currents through orifices 66, 67, and 68 respectively. For sufficiently negative $V_c$ the electron gas is completely depleted underneath the prism and the impinging ballistic electrons are totally reflected. Beyond this pinch-off voltage the density n' under the prism monotonically increases with $V_c$. For very small n', the electrons are strongly refracted toward the normal as they leave the prism, directing them to the left of orifice 66. As n' is further increased, the beam of electrons leaving the prism is swept sequentially across orifices 66, 67, and 68. This is shown in the data of FIG. 5: the peaks of traces (a), (b), and (c) occur at sequentially greater values of $V_c$.

By a known procedure we determined that for the instant exemplary embodiment $n'(V_c) = 1.14 \times 10^{11}(V_c + 1.33) cm^{-2}$. This means that for $V_c < -1.33$ V, the electron gas is depleted below the prism and all carriers are totally reflected. At $V_c = 0.51$ V the density underneath the prism equals the density outside and no refraction occurs. Given the dependence $n'(V_c)$ and the value for $n = 2.10 \times 10^{11} cm^{-2}$ the density outside the prism, the effective relative index of refraction between the regions underneath and outside the prism is known for any $V_c$.

In order to model the data a ray tracing simulation was performed. The results are also shown in FIG. 5 as curves a', b', and c'. The curves show the number of electrons (in arbitrary units) that arrive at orifices 66, 67, and 68, respectively, as a function of $V_c$. The positions of the calculated peaks agree well with the measured values. As the above results demonstrate, the exemplary embodiment of the invention can, inter alia, serve to switch an arbitrary input signal between a multiplicity of outputs, and/or serve as a multi-valued logic element.

Figure 6:
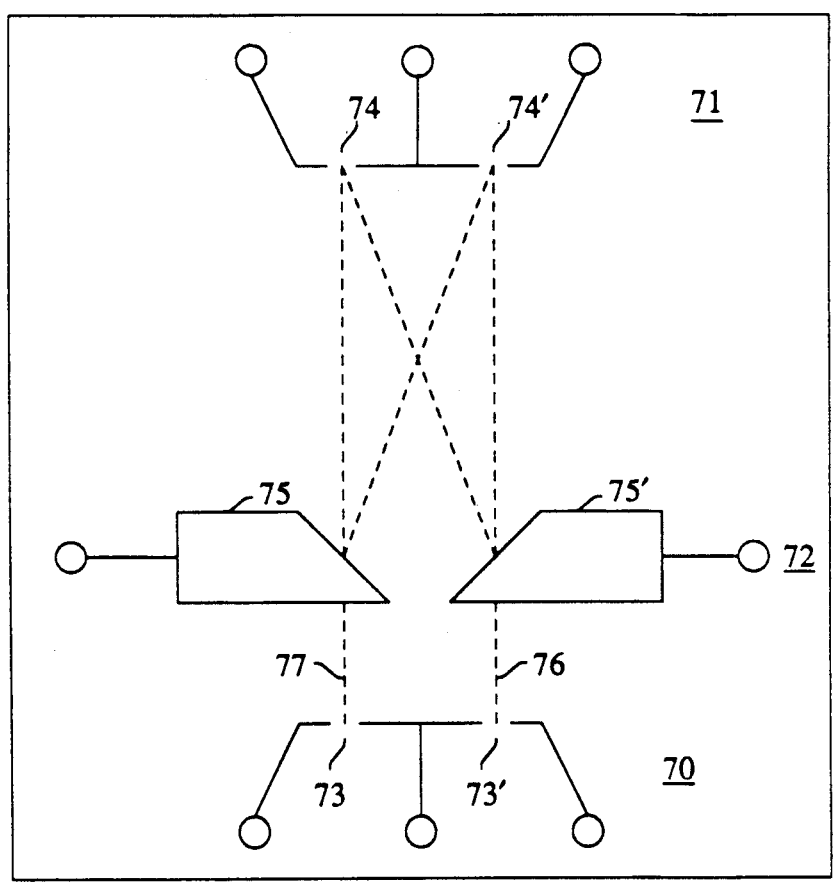

The fact that in devices according to the invention electron beams can, on theoretical grounds, be expected to cross substantially without interfering with each other makes possible a variety of further embodiments. A particular such embodiment is schematically depicted in FIG. 6. As in FIGS. 2 and 4, means for applying voltages, detecting currents, etc. are not shown, since they are well known to those skilled in the art. The embodiment of FIG. 6 comprises emission means 70, collection means 71, and control means 72, wherein 70 comprises means that define a multiplicity of orifices (73 and 73'), 71 also comprises means that define a multiplicity of orifices (74 and 74'), and 72 comprises a multiplicity of separately addressable refractive elements (75 and 75'). An electron beam 76 from orifice 73' can be caused to enter either (or none) of orifices 74 and 74' through application of an appropriate voltage to prism 75'. Similarly, electron beam 77 from orifice 73 can be caused to enter either (or none) or orifices 74 and 74' through application of an appropriate voltage to prism 75. The exemplary device thus can, inter alia, serve as a multipole switch for a multiplicity of arbitrary input signals and/or as a novel multivalued logic element.

It will be appreciated that neither the number of emitter orifices nor the number of collector orifices and/or prisms is limited to two as shown in FIG. 6.

What is claimed is:

1. Apparatus comprising an electronic device that comprises
   (a) a semiconductor body comprising a 2-dimensional electron gas (2 DEG);
   (b) emission means of ballistic 2 DEG electrons;
   (c) collection means of 2 DEG electrons, the collection means spaced apart from the emission means;
   (d) control means of ballistic 2 DEG electrons, the control means comprising conductor means disposed between the emission means and the collection means; and
   (e) means for making electrical contact to the emission means, the control means, and the collection means; wherein
   (f) the control means are adapted for changing the electrostatic potential in a portion of the semiconductor body that underlies the conductor means and wherein the conductor means are situated such that ballistic 2 DEG electrons that travel from the emission means to the collection means pass through said portion of the semiconductor body, such that the trajectory of said ballistic 2 DEG electrons is a function of a voltage applied to the control means.

2. Apparatus of claim 1, wherein the semiconductor body comprises a semiconductor heterostructure comprising a first semiconductor region and a second semiconductor layer on the region, with the first and second semiconductor differing in chemical composition.

3. Apparatus of claim 1, wherein the conductor means comprise electrode means shaped such that at least some of the ballistic electrons from the emission means can be directed onto the collection means.

4. Apparatus of claim 3, wherein the device comprises a multiplicity of collection means, and wherein at least some of the ballistic electrons from the emission means can be switched between the respective collection means.

5. Apparatus of claim 4, wherein associated with the device is an axis from the emission means to the collection means, the electrode means being defined by a multiplicity of bounding lines, with at least one of the bounding lines intersecting the axis at an oblique angle.

6. Apparatus of claim 1, wherein associated with the ballistic electrons emitted from the emission means is an angle of divergence, and the control means are adapted for changing the angle of divergence of the ballistic electrons.

7. Apparatus of claim 3, wherein the device comprises a multiplicity of emission means and a multiplicity of collection means, and wherein at least some of the ballistic electrons from a given emission means can be switched between at least some of the collection means.

8. Apparatus of claim 7, wherein the multiplicity of emissions means and the multiplicity of collection means are arranged such that at least the path of ballistic electrons traveling from a first emission means to a first collection means intersects the path of ballistic electrons traveling from a second emission means to a second collection means.

* * * * *